(12) United States Patent
Thalheim et al.

(10) Patent No.: US 8,598,921 B2
(45) Date of Patent: Dec. 3, 2013

(54) CONTROL CIRCUIT AND METHOD FOR CONTROLLING A POWER SEMICONDUCTOR SWITCH

(75) Inventors: Jan Thalheim, Biel (CH); Olivier Garcia, Bruegg (CH)

(73) Assignee: CT-Concept Holding GmbH, Biel (CH)

( * ) Notice: Subject to any disclaimer, the term of this patent is extended or adjusted under 35 U.S.C. 154(b) by 49 days.

(21) Appl. No.: 13/421,581

(22) Filed: Mar. 15, 2012

(65) Prior Publication Data
US 2012/0200320 A1 Aug. 9, 2012

(30) Foreign Application Priority Data
Mar. 16, 2011 (EP) .................................... 11002165

(51) Int. Cl.
*H03K 3/00* (2006.01)
(52) U.S. Cl.
USPC .......................................... 327/109; 327/108
(58) Field of Classification Search
USPC ................................................. 327/108–112
See application file for complete search history.

(56) References Cited

U.S. PATENT DOCUMENTS

| 4,423,457 | A | 12/1983 | Brajder |
| 5,914,619 | A * | 6/1999 | Tihanyi ........................ 327/109 |
| 8,493,101 | B2 * | 7/2013 | Vogler et al. .................. 327/108 |
| 2006/0066366 | A1* | 3/2006 | Oliver, Jr. ...................... 327/111 |
| 2008/0211547 | A1* | 9/2008 | Iwagami et al. ............... 327/108 |

FOREIGN PATENT DOCUMENTS

| DE | 32 43 467 A1 | 5/1984 |
| DE | 44 10 978 A1 | 10/1994 |
| EP | 0 190 925 A2 | 8/1986 |

OTHER PUBLICATIONS

Jan Thalheim et al.: "Universal Chipset for IGBT and Power-MOSFET Gate Drivers", PCIM Europe, Nuernberg, Germany, 2007.
C.T. Concept Technologie AG: 2SC0435T Description and Application Manual, Version 24, Sep. 2010, "Dual-Channel High-power Low-cost IGBT Driver", pp. 1-18.
European Search Report dated Aug. 22, 2011 of EP No. 11002165.6-2215.

* cited by examiner

*Primary Examiner* — Ryan Jager
(74) *Attorney, Agent, or Firm* — Kenyon and Kenyon LLP

(57) ABSTRACT

A driving circuit for driving a power semiconductor switch wherein at least one semiconductor device being provided which is implemented in such a way that it is operated in breakdown in response to the exceeding of a specific collector-emitter voltage of the power semiconductor switch, an output of the at least one semiconductor device being connected via a conductive interconnect to a terminal between the resistors of the resistor series circuit or to the resistor-series-circuit output which is connected to the signal processing unit, and the breakdown voltage of the at least one semiconductor device being selected in such a way that the potential at the output of the at least one semiconductor device is greater than the potential at the gate of the power semiconductor switch in its ON state. The invention further relates to a method for driving a power semiconductor switch.

11 Claims, 7 Drawing Sheets

CONTROL CIRCUIT AND METHOD FOR CONTROLLING A POWER SEMICONDUCTOR SWITCH

REFERENCE TO RELATED PATENT APPLICATIONS

This application claims the priority of the European Patent Application No. 11 002 165.6, which was filed on Mar. 16, 2011, and whose entire disclosure is herewith incorporated by reference.

FIELD OF THE INVENTION

The present invention relates to a driving circuit and a method for driving a power semiconductor switch according to the preamble of the independent claims.

BACKGROUND INFORMATION

When working with power semiconductor devices, especially power semiconductor devices having a MOSFET control head, as a rule, it takes a certain time until the power semiconductor device (hereinafter also component or element, for short) is completely turned on and the voltage, which drops across the load terminals or power terminals of the device, and in the case of IGBTs, corresponds to the collector-emitter voltage usually denoted by VCE, has fallen to the desired low values. In the event of a fault, e.g., if an IGBT is turned on when there is a short circuit, the resulting output current through the load terminals of the device may become so high that it exceeds the output-current values which the IGBT provides in the linear operating range. In such a case, the output current reaches a saturation value, while the collector-emitter voltage of the IGBT remains at a high level. This results in a very high power loss of the IGBT.

Therefore, there is the need to limit the energy in the power semiconductor device in order to avoid its destruction. To that end, the on-time of the device in the case of a short circuit is typically limited to 10 μs. To monitor the proper operation, typically, what is termed VCE monitoring is used, by which it is possible to recognize whether the output current of the power semiconductor switch is exceeding a current permissible for its proper operation, i.e., the VCE monitoring is used to recognize an overcurrent at the output of the semiconductor switch. During the VCE monitoring, the collector-emitter voltage of the IGBT, i.e., the voltage drop across the IGBT, is measured and compared to a setpoint value (a reference voltage) which the intention is to stay below within the permissible short-circuit duration during proper operation (also called normal operation). During normal operation, after the above-mentioned time of typically 10 μs permissible for the short-circuit operation has passed, the collector-emitter voltage has usually fallen off to a value of less than 10 V. However, depending on the voltage class of the device, its operating conditions, the technology used for the device and the adjustment of the charge-carrier plasma in the device, higher values are also possible and permissible for the collector-emitter voltage such as, for example, collector-emitter voltage values in the range of up to 1000 V for IGBTs of the voltage class 6.5 kV. Here, the collector-emitter voltage typically drops to below 10 V only after a longer ON duration than would be permissible for the short-circuit case.

Several methods for VCE monitoring are known from the related art. Thus, the American patent U.S. Pat. No. 4,423,457 describes a method in which the high voltage occurring at the collector of a transistor is limited by a diode to values which can be processed by the circuit downstream of the device. The cathode of the diode is connected to the collector of the transistor. A current source implemented within a driving circuit for the transistor is connected to the anode of the diode. The diode has a reverse voltage which is higher than the voltage defined by the voltage class of the transistor to be driven. For even higher reverse voltages, a plurality of diodes are connected in series. The potential at the anode of the diode follows the potential of the collector of the transistor plus the forward voltage of the diode until the output voltage of the voltage source connected to the anode is limited to a voltage value made available by the driving circuit. The maximally measurable collector-emitter voltage is thus limited to its supply voltage minus the forward voltage of the diode. With the method described in U.S. Pat. No. 4,423,457, typically collector-emitter voltages of less than 10 V are measurable after the time allowed for the short-circuit operation has elapsed. In principle, this is sufficient for IGBT voltage classes of 600 V to 1700 V.

During the closing operation in normal operation, the VCE monitoring is usually deactivated during a suppression time. The suppression time is set in a simple manner by a capacitor which is connected to the current source. During the OFF state of the transistor, this capacitor is discharged with the aid of a signal-processing unit via a switch, and in response to the closing operation of the transistor, is charged via the current source.

"Universal Chipset for IGBT and Power-MOSFET Gate Drivers" by Jan Thalheim and Heinz Rüedi, PCIM Europe, Nürnberg, 2007, likewise describes a method for VCE monitoring, which is explained in the following with reference to FIG. 1. FIG. 1 shows a circuit configuration 1 having a driving circuit 2 and a power semiconductor switch S with driven gate terminal G (also denoted as gate), that permits VCE monitoring with the aid of a compensated voltage divider. Driving circuit 2 is used to drive power semiconductor switch S. A voltage divider, which is formed by resistors RVCE1, RVCE2, RVCE3 and RME, is used to reduce the high voltage, occurring at power terminal/collector C of power semiconductor switch S in case of a fault, to values which lie within the permissible input-voltage range of comparator COMP of the following/downstream signal-processing unit. In the case of the voltage divider, resistors RVCE1, RVCE2, RVCE3 are connected in series. Typically, the values of resistors RVCE1, RVCE2, RVCE3 must be selected to be very high in order to keep the power loss within these resistors, and thus the costs for the components and cooling measures which may be necessary, as low as possible. Because of these high values for resistors RVCE1, RVCE2, RVCE3, and the parasitic input capacitor CAP of the signal-processing unit or of comparator COMP, (including their wiring), a relatively high time constant or response time results for the circuit configuration, leading to a corresponding signal delay. Furthermore, parasitic input capacitor CAP can fluctuate sharply in terms of value depending on the process. Particularly in the case of a more complex wiring with the aid of a printed circuit board (PCB), parasitic input capacitor CAP may depend strongly on the layer construction, the manufacturer and the production lot.

To reduce this effect, that is, the relatively high time constant caused possibly by parasitic input capacitor CAP, a compensated voltage divider may be used, in which dominant capacitors CVCE1, CVCE2, CVCE3, CME are assigned to resistors RVCE1, RVCE2, RVCE3, RME (see FIG. 1). The disadvantages in so doing are an additionally necessary space requirement, a decrease in the maximally permitted operating temperature, an increased number of components, increased costs and, as a rule, reduced reliability. A further disadvantage in using such a compensated voltage divider is that, given a monolithic integration of comparator COMP and control unit CONTROL of the signal-processing unit, a suppression time, in which the VCE monitoring is deactivated, must be set subsequent to the comparison of the measured collector-emitter voltage to the setpoint value carried out by comparator COMP, thus, must be carried out within or with the aid of control unit CONTROL. However, this requires additional measures for setting the suppression time, such as a digital programming or further connecting pins at the monolithically integrated signal-processing unit.

The indicated disadvantages of the compensated voltage divider may be avoided by not using dominant capacitors for compensating the above-indicated voltage divider RVCE1, RVCE2, RVCE3, RME, but instead, by increasing the input capacitance of the signal-processing unit following power semiconductor switch S, by connecting a (dominant) response-time capacitor CA in parallel to parasitic input capacitor CAP, such that the driving-circuit time constant needed for the realization of the suppression time of the VCE monitoring results. Typically, a response-time resistor RA is assigned to response-time capacitor CA. This is illustrated in FIG. 2, which shows a circuit configuration 1' having a driving circuit 2' and a power semiconductor switch S, by which VCE monitoring may be carried out. During the OFF state of power semiconductor switch S, response-time capacitor CA is discharged with the aid of control unit CONTROL via a switch M_D to a lower potential in the form of a predefined reference potential Com or vee of driving circuit 2'. Upon the closing operation of power semiconductor switch S, response-time capacitor CA is then charged via resistor network RVCE1, RVCE2, RVCE3 connected to collector C of power semiconductor switch S. In this context, however, a decrease of the collector-emitter voltage leads to a prolongation of the response time proportional to the decrease. This can lead to an unintentional restriction with respect to the optimal design and operation of power semiconductor switch S, even though the short-circuit energy can be held constant to a great extent in circuit configuration 1' shown in FIG. 2.

In order to minimize the variation of the response time in a wide range of the collector-emitter voltage, it is suggested in "2SC0435T Description and Application Manual", CT-Concept Technologie AG, version 24, September 2010 (particularly page 10), available at http://www.igbt-driver.com/fileadmin/Public/PDF/Products/ENG/SCALE2/Cores/2SCO 435T/2SC0435T_Manual.pdf), to limit the potential VCM at the midpoint of the voltage divider, formed by resistors RVCE1, RVCE2, RVCE3, RME, with the aid of a diode DGH (see FIG. 2) to a maximum value VCM_MAX, namely, to an at least partially constant potential, available in driving circuit 2' for power semiconductor switch S, plus the forward voltage of diode DGH. For small collector-emitter voltages, the voltage divider formed by resistors RVCE1, RVCE2, RVCE3, RME acts in linear fashion. For greater collector-emitter voltages, the output voltage of this voltage divider is limited by diode DGH to the maximum value VCM_MAX. Thus, according to approximation, for collector-emitter voltages which are greater than VCM*RVCE/(RME∥RA), the value for VCM and therefore the response time are constant, RVCE corresponding to the sum of the resistance values of resistors RVCE1, RVCE2, RVCE3, and RME∥RA corresponding to the resistance value of the parallel connection of resistors RME and RA. For example, maximum value VCM_MAX may be derived from operating/supply voltage Viso, or from a voltage, switched into driving circuit 2' by control unit CONTROL, for gate terminal G of the power semiconductor switch. The switched voltage may be the output voltage at output GH of an output stage M_ON—responsible for the ON state of power semiconductor switch S—of control unit CONTROL. Voltage VCM at the midpoint of voltage divider RVCE1, RVCE2, RVCE3, RME is limited to this maximum value VCM_MAX so long as the collector-emitter voltage is greater than a predefined limiting value VCE_MIN. For collector-emitter voltages which lie below limiting value VCE_MIN, however, the voltage at midpoint VCM of voltage divider RVCE1, RVCE2, RVCE3, RME is less than maximum value VCM_MAX, so that the response time is prolonged accordingly in this case, as well. In general, the driving circuit described in "2SC0435T Description and Application Manual", CT-Concept Technologie AG, version 24, September 2010 is sufficient for IGBT voltage classes of 600 V to 1700 V.

In principle, the response time of circuit configuration 1', i.e., of driving circuit 2', determined by response-time capacitor CA and response-time resistor RA assigned to it (see FIG. 2), should be held constant in a wide range of the collector-emitter voltage. This is achieved by minimizing the quotient or factor VCE_MIN/VCM_MAX of value VCM_MAX defined above and predefined minimum collector-emitter voltage VCE_MIN.

For example, factor VCE_MIN/VCM_MAX may be minimized by increasing the current flowing to midpoint VCM of the resistor network formed by resistors RVCE1, RVCE2, RVCE3, RME, for instance, by reducing the resistance values of resistor network RVCE1, RVCE2, RVCE3 connected to collector C of power semiconductor switch S. However, this measure conflicts with the fact that, as mentioned at the outset, the values of resistors RVCE1, RVCE2, RVCE3 of the resistor network, connected in series to collector C, should be selected to be very high in order to keep the power loss within resistors RVCE1, RVCE2, RVCE3, caused by a high collector-emitter voltage, and therefore the costs for the components and cooling measures which may be necessary, as low as possible.

Alternatively, factor VCE_MIN/VCM_MAX may be minimized by reducing the current flowing away from midpoint VCM of the resistor network formed by resistors RVCE1, RVCE2, RVCE3, RME, for example, by increasing or maximizing the value of response-time resistor RA. In addition, the value of resistor RME of the voltage divider could also be increased. Resistor RME may be omitted in circuit configuration 1' shown in FIG. 2, since the input voltage for comparator COMP is already limited by diode DGH. However, the result of these measures would be that, in the case of the predefined response time, the value for response-time capacitor CA would have to be reduced accordingly, the result being that the response time would be influenced more strongly by parasitic and process-dependent capacitor CAP. Particularly for a cost-effective, compact design of the circuit configuration having a more complex driving circuit (also called driver), the parasitic effects are typically dominating to such an extent that a production-suitable tuning of the response time of the circuit configuration, above all with regard to process control and thermal stress of the components, can only be realized with difficulty, especially for IGBT voltage classes of 3300 V to 6500V.

The consequence of parasitic effects becomes even more relevant, and therefore the tuning suitable for production is rendered even more difficult, if both the VCE monitoring, i.e., the monitoring of the collector-emitter voltage of power semiconductor switch S described at the outset, and a dynamic so-called active clamping function (opening overvoltage limiting function) are to be realized by the driving circuit. The active clamping function is used to limit an overvoltage possibly occurring when turning power semiconductor switch S off. A circuit configuration 1" having such a driving circuit 2" is shown in FIG. 3 (internal knowledge of the Applicant at the date of filing).

By the use of the active clamping function, an overvoltage possibly occurring upon turning off power semiconductor switch S is limited with the aid of series-connected semiconductor devices DZCE0, DZCE1, DZCE2, DZCE3 (for example, Zener diodes, avalanche diodes (see http://de.wikipedia.org/wiki/Avalanchediode) and/or transient-voltage-suppressor diodes (see http://de.wikipedia.org/wiki/Suppressordiode)), which are operated in breakdown when a specific collector-emitter voltage is exceeded, by turning power semiconductor switch S on again, the potential at gate terminal G of power semiconductor switch S being raised for a time approximately to the level of supply voltage Viso.

The effectiveness of the active clamping function can be further improved by reducing the output current of control unit CONTROL available on the gate-terminal line (also called gate line) which leads from control unit CONTROL (also called gate driver) to gate terminal G of power semiconductor switch S. This is achieved by returning a portion of the current of semiconductor devices DZCE0, DZCE1, DZCE2, DZCE3 operated in breakdown, across a resistor RACL to a control input ACL of control unit CONTROL. Control input ACL is preferably a low-impedance input of a current mirror circuit, the output current available at output GL of an output stage M_OFF of control unit CONTROL responsible for the OFF state or opening operation of power semiconductor switch S being reduced as a function of the current flowing into control input ACL.

According to the related art, when working with a dynamic active-clamping function, one semiconductor device DZCE0 of serially-connected semiconductor devices DZCE0, DZCE1, DZCE2, DZCE3 operated in breakdown is bypassed for a certain time during the circuit-breaking operation of power semiconductor switch S. The goal of the dynamic active-clamping function is, on one hand, to increase the sum of the breakdown voltages in the OFF state of power semiconductor switch S, and on the other hand, to reduce the sum of the breakdown voltages during the actual circuit-breaking operation, so that the performance capability of power semiconductor switch S may be better utilized without leaving its safe operating area.

However, in realizing the VCE monitoring and the dynamic active-clamping function in a circuit configuration 1" or driving circuit 2" as shown in FIG. 3, the following difficulties are apparent. As mentioned above, one semiconductor device DZCE0, that is, a part of the serially-connected semiconductor devices DZCE0, DZCE1, DZCE2, DZCE3 operated in breakdown in response to the exceedance of a specific collector-emitter voltage, is bypassed for a certain time during the circuit-breaking operation of power semiconductor switch S. The bypass is accomplished by a switch M_DAAC, which is driven by control unit CONTROL via a gate terminal CTRL_DAAC.

However, if switch M_DAAC is closed during a closing operation of power semiconductor switch S, then, because of the change in the voltage drop across M_DAAC, an unintentional charge transfer results between parasitic capacitors CP and response-time capacitor CA. The tuning of the response time or response-time constant, especially the observance of low tolerances of the response time in the case of process fluctuations, is thereby further hampered. In the circuit topology shown in FIG. 3, the minimization of the influence of parasitic capacitors CP, which arises between resistors RVCE1, RVCE2, RVCE3 of the resistor series circuit and the anodes of semiconductor devices DZCE1, DZCE2, DZCE3, would require a relatively complex control of the optimal instant for the change in the switching state of switch M_DAAC, and therefore a complex control unit CONTROL. However, a complex control unit CONTROL also calls for a costly feeding of control unit CONTROL. In particular, it is necessary that control unit CONTROL be designed in such a way that, in response to the exceedance of the breakdown voltages of semiconductor devices DZCE1, DZCE2, DZCE3 during the circuit-breaking operation of power semiconductor switch S, because of an overvoltage occurring at power semiconductor switch S, control unit CONTROL turns power semiconductor switch S on again for a time by raising the potential at gate terminal G of power semiconductor switch S for a time approximately to the level of supply voltage Viso. Thus, control unit CONTROL must be designed to carry out the active clamping function. In addition, at the same time, control unit CONTROL must ensure that switch M_DAAC remains safely closed, so as not to unintentionally increase the nominal value for the permissible overvoltage during the circuit-breaking operation of the power semiconductor switch. For this, it is necessary that the potential at gate terminal CTRL_DAAC of switch M_DAAC be higher than the potential at gate terminal G of power semiconductor switch S, and furthermore, be higher than the level of supply voltage Viso. This usually requires the use of relatively complex "charge-pump" or "bootstrap" feedings. However, because of the high charge at the gate terminal of switch M_DAAC, a relatively high stress of the feeding results, especially when power semiconductor switch S is operated at higher switching rates.

DETAILED DESCRIPTION OF THE PRESENT INVENTION

The object of the present invention is to provide a driving circuit which is improved compared to the driving circuits described at the outset and a method for driving a power semiconductor switch which is improved compared to the methods described at the outset, by which the influence of parasitic capacitors is able to be reduced, in particular, is able to be minimized. It is further an object of the invention to provide a driving circuit and a method for driving a power semiconductor switch of less complexity, particularly of reduced complexity compared to the driving circuit and the corresponding method described in connection with FIG. 3. A further object of the present invention is to provide a driving circuit and a method for driving a power semiconductor switch in which the thermal stress of the components is low, in particular, is reduced or minimized compared to the driving circuits and methods described at the outset. Furthermore, it is an object of the invention to provide a driving circuit and a method for driving a power semiconductor switch which permit a simple tuning of the driving circuit and its response time, especially in comparison to the driving circuits and methods described at the outset. A further object of the present invention is to provide a driving circuit and a method having improved stability and robustness with regard to fluctuations in the (manufacturing-) process. In addition, it is an object of the invention to provide a driving circuit and a method for driving a power semiconductor switch by which, besides VCE monitoring, a dynamic active-clamping function is able to be realized, in doing which, in particular, the expenditure for the necessary control and feeding is reduced compared to the embodiment described in connection with FIG. 3.

These objectives are achieved by a driving circuit and a method having the features set forth in the independent claims.

The driving circuit according to the present invention for driving a power semiconductor switch has a signal-processing unit for generating a gate-terminal signal for a gate terminal (also called gate) of a power semiconductor switch. The driving circuit includes a resistor series circuit which is connectable to a power terminal—used for the power supply and hereinafter also denoted as collector—of the power semiconductor switch, and whose output is connected, at least indirectly, to a first input of the signal-processing unit. The signal-processing unit has a second input for a reference voltage for the collector-emitter voltage of the power semiconductor switch. In addition, the driving circuit includes at least one semiconductor device which is implemented in such a way that it is operated in breakdown in response to the exceedance of a specific, predefined collector-emitter voltage of the power semiconductor switch. One output of the at least one semiconductor device is connected via a conductive interconnect to a [terminal] between the resistors of the resistor series circuit or to the output of the resistor series circuit which is connected to the signal-processing unit. The conductive interconnect preferably has no electronic devices. The breakdown voltage of the at least one semiconductor device is selected in such a way that the potential at the output of the at least one semiconductor device, which is connected to the conductive interconnect, is greater than the potential at the gate of the power semiconductor switch in the ON state of the power semiconductor switch, in particular, is greater than 100 V. By preference, the potential at this output of the at least one semiconductor device corresponds to its breakdown voltage, which preferably is greater than 100 V.

According to one preferred development, a response-time network is provided which includes at least one response-time resistor via which the resistor-series-circuit output remote from the collector is connected to the first input of the signal-processing unit, the response time of the driving circuit being a function of the time constant of the response-time network.

In the method of the present invention for driving a power semiconductor switch with the aid of the driving circuit according to the invention, the signal-processing unit—from the signal applied to its first input and from the reference voltage for the collector-emitter voltage of the power semiconductor switch—ascertains a gate signal for the gate of the power semiconductor switch. In response to the exceedance of the specific, predefined collector-emitter voltage, the at least one semiconductor device is then operated in breakdown, and the potential at the resistor-series-circuit output connected with the conductive interconnect, i.e., at the terminal situated between the resistors of the resistor series circuit and connected with the conductive interconnect, is limited to a value which is greater than the potential at the gate of the power semiconductor switch in the ON state of the power semiconductor switch and which preferably is greater than 100 V. In breakdown of the at least one semiconductor device, the potential at the resistor-series-circuit output connected with the conductive interconnect, that is, at the terminal situated between the resistors of the resistor series circuit and connected with the conductive interconnect, preferably corresponds to the breakdown voltage of the semiconductor device. The signal applied to the first input of the signal-processing unit is derived from the potential at the collector of the power semiconductor switch and is compared by the signal-processing unit to the reference voltage in order to generate the gate signal for its gate.

Advantageously, the driving circuit and the method according to the present invention make it substantially easier to keep the response time constant in a wide range of values possible for the collector-emitter voltage. The influence and the problem of parasitic capacitors are able to be decreased. The driving circuit and the method of the present invention are suitable both for turning on a power semiconductor switch into the short circuit (so-called short circuit of type 1), and for the case of a short circuit in the ON state of the semiconductor switch (so-called short circuit of type 2).

According to an especially preferred embodiment, the driving circuit of the present invention has a plurality of serially-connected semiconductor devices which, in response to the exceedance of the specific, predefined collector-emitter voltage for the power semiconductor switch, are operated in breakdown, and of which, the at least one semiconductor element indicated above is one. In response to the exceedance of the breakdown voltage of the serially-connected semiconductor devices, the signal-processing unit preferably increases the instantaneous value of the gate signal for the gate of the power semiconductor switch. Owing to these measures, in addition to a VCE monitoring (i.e., an overcurrent detection), a dynamic active-clamping function (opening overvoltage limiting function) may be realized for a power semiconductor switch.

For example, the power semiconductor switch, which is able to be driven or operated by the driving circuit and the method of the present invention, may form part of a switch module, especially of a half-bridge arm of a converter, for traction mode, for industrial electrical drives, for solar energy, for wind energy, for H.V. DC transmission and/or for a flexible AC transmission system (FACTS). In particular, the power semiconductor switch may be a bipolar transistor (BJT), a bipolar transistor with integrated gate electrode (IGBT), a metal-oxide semiconductor field-effect transistor (MOSFET) or a combination of these devices.

BRIEF DESCRIPTION OF THE DRAWING

Further advantageous embodiments of the present invention are derived from the dependent claims and the exemplary embodiments described in the following with reference to the drawing, in which:

Identical reference symbols in the Figures denote identical or identically-acting components or elements. FIGS. 1 through 3 are already described in the introductory part of the specification and reference is made to it.

Manner(s) of Implementing the Present Invention

Figure 4:
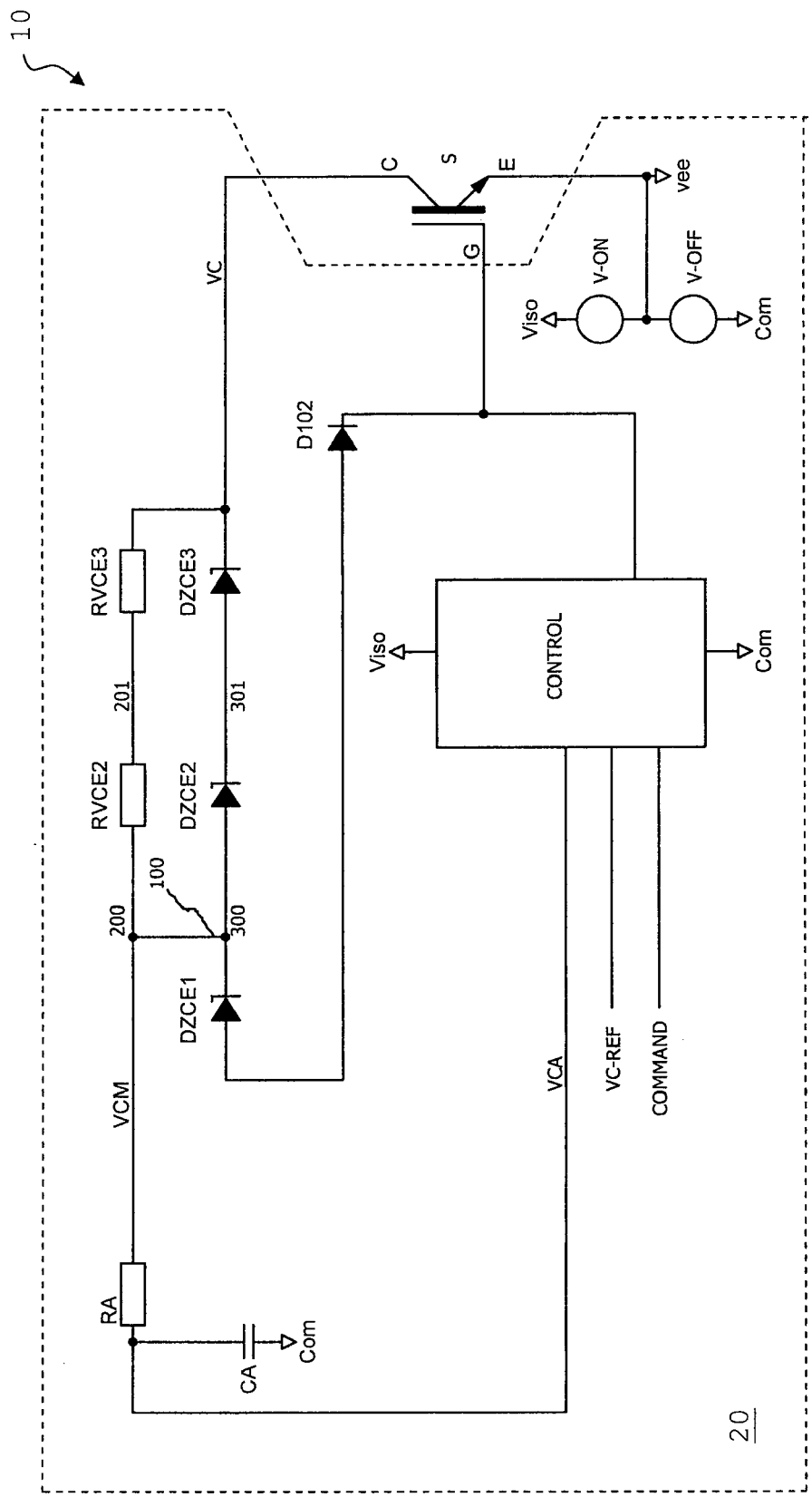
FIG. 4 shows a schematic circuit diagram of a circuit configuration having a first exemplary embodiment of a driving circuit according to the present invention and a power semiconductor switch.

FIG. 4 shows a circuit configuration 10 having a first exemplary embodiment of a driving circuit 20 according to the present invention, and a power semiconductor switch S. Driving circuit 20 has a signal-processing unit CONTROL which has a first input for a voltage VCA derived from a collector-emitter voltage of power semiconductor switch S and a second input for a reference voltage VC-REF. Signal-processing unit CONTROL includes a comparator which compares voltage VCA to reference voltage VC-REF, forming a comparison value. Signal-processing unit CONTROL further includes a control unit which outputs a gate signal via a control output to gate G of power semiconductor switch S as a function of the comparison value. In the exemplary embodiment illustrated in FIG. 4, the comparator and the control unit are shown integrated as signal-processing unit CONTROL.

Driving circuit 20 further includes a resistor series circuit made up of resistors RVCE2 and RVCE3, which is connected to collector C of power semiconductor switch S and whose collector-remote output with potential VCM is preferably connected—via a response-time network, formed of a response-time resistor RA and a response-time capacitor CA assigned to it and connected to a reference potential Com—to the first input of signal-processing unit CONTROL, to which the voltage, i.e., potential VCA is applied. The resistor series circuit is used for the VCE monitoring.

Driving circuit 20 further includes a series circuit made up of semiconductor devices DZCE1, DZCE2, DZCE3 which are rated in such a way that they switch into breakdown in response to a specific, predefined collector-emitter voltage of power semiconductor switch S. In particular, semiconductor devices DZCE1, DZCE2, DZCE3 are Zener diodes, avalanche diodes and/or transient-voltage suppressor diodes. The semiconductor-device series circuit is connected on the cathode side to collector C of power semiconductor switch S. On the anode side, the semiconductor-device series circuit is connected, e.g., via a diode D102 disposed in reverse direction, to the control output of signal-processing unit CONTROL. Due to the semiconductor-device series circuit, a dynamic active-clamping function is realized in which signal-processing unit CONTROL preferably increases the gate signal for gate G of power semiconductor switch S, that is, increases its (instantaneous) value in the event the breakdown voltages of semiconductor devices DZCE1, DZCE2, DZCE3 are exceeded.

Figure 1:
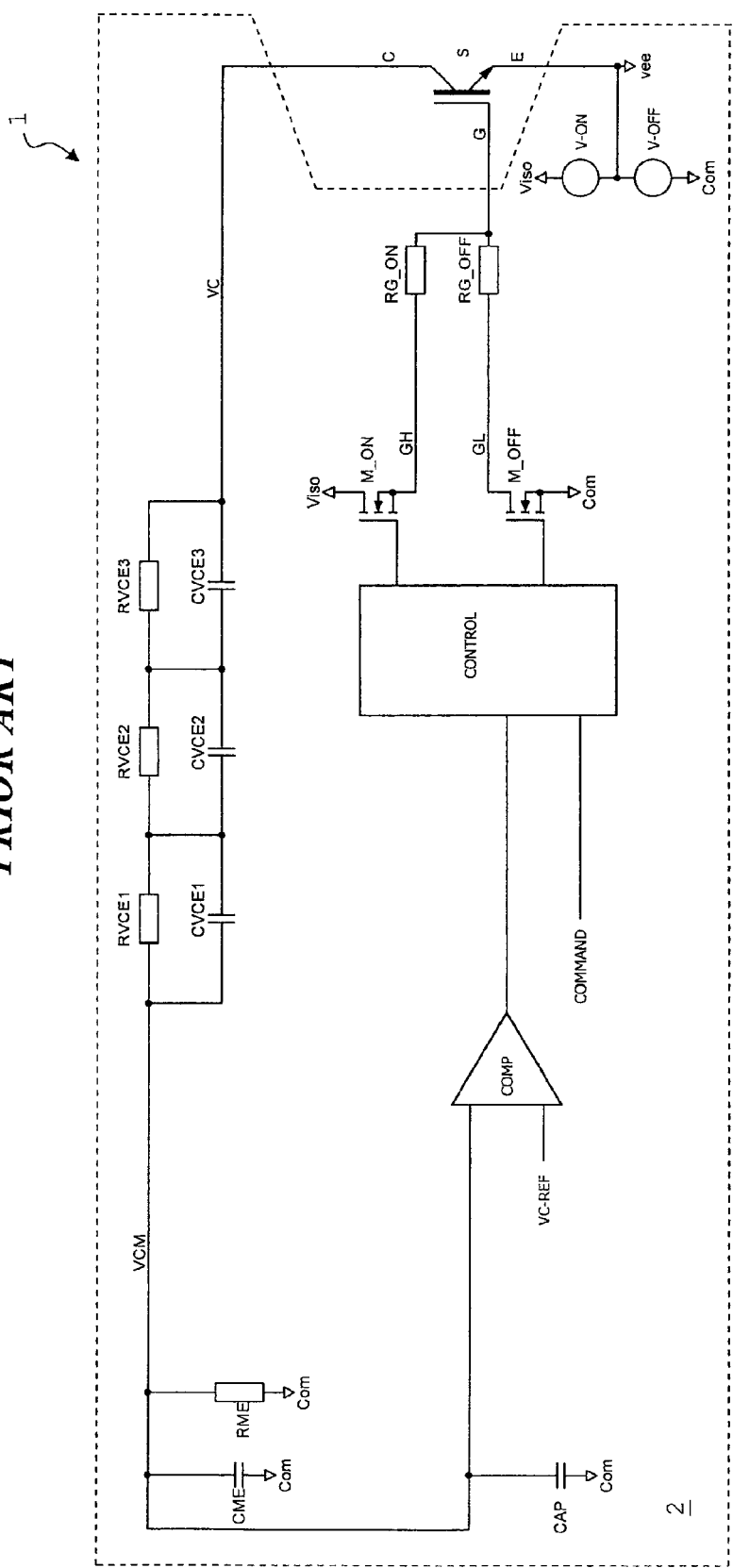
FIG. 1 shows a schematic circuit diagram of a known circuit configuration having a driving circuit with VCE monitoring, and a power semiconductor switch.
Figure 2:
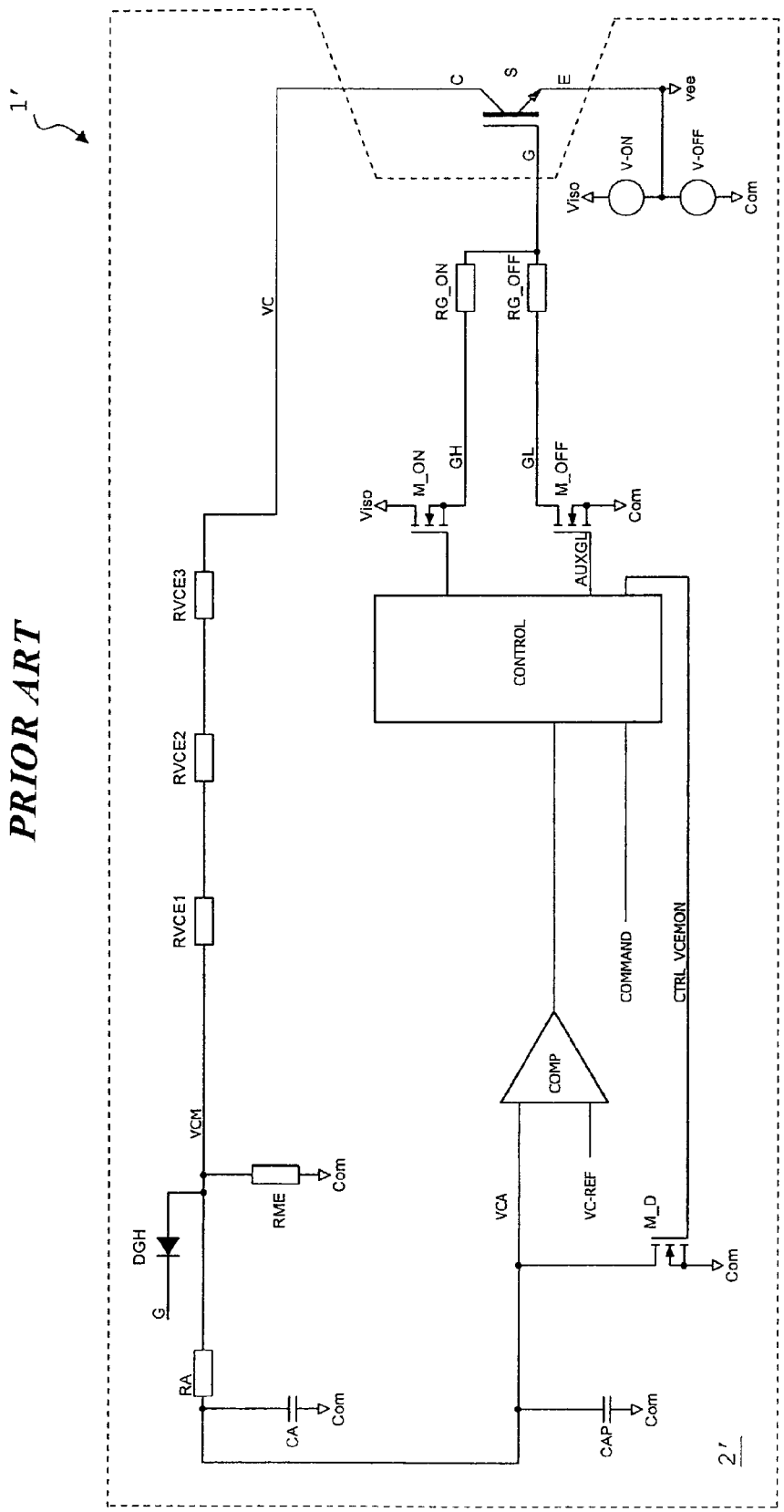
FIG. 2 shows a schematic circuit diagram of a further known circuit configuration having a driving circuit with VCE monitoring, and a power semiconductor switch.
Figure 3:
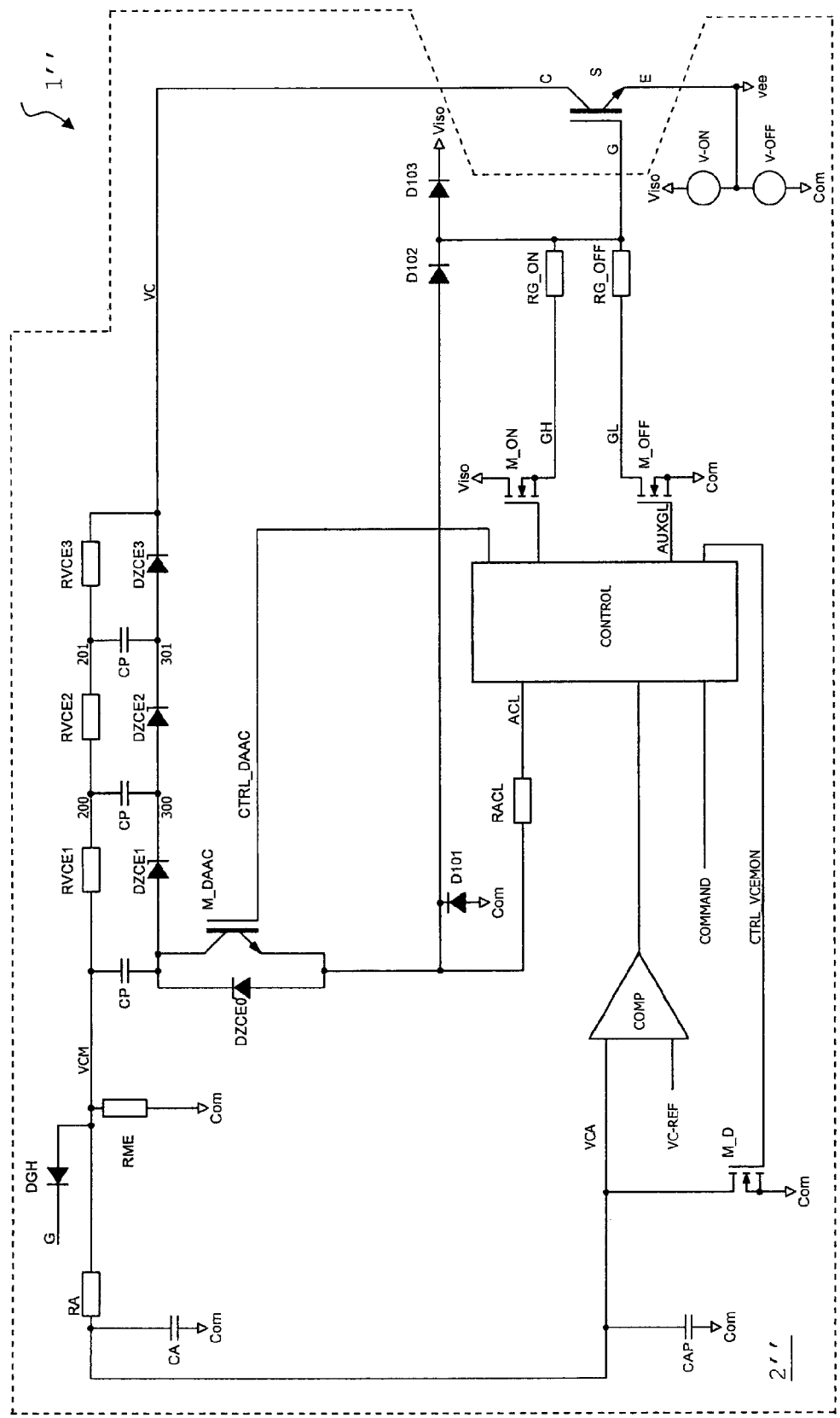
FIG. 3 shows a schematic circuit diagram of a circuit configuration having a driving circuit with VCE monitoring and realization of an active clamping function and a power semiconductor switch, which forms internal knowledge of the Applicant at the date of filing.

A terminal 300 between two semiconductor devices DZCE1, DZCE2 is connected via a conductive interconnect 100 to resistor-series-circuit output 200 remote from the collector. The result is that, differing from driving circuit 2" shown in FIG. 3, the potential at output 200 of the resistor series circuit is held constant and therefore stabilized with the aid of conductive interconnect 100 at least for a time, namely, for the time of the breakdown of semiconductor device DZCE1, since it is limited to a value which is determined by semiconductor device DZCE1 operated in breakdown, especially by its breakdown voltage. In this context, the breakdown voltage of semiconductor device DZCE1 is preferably greater than 100 V.

Figure 5:
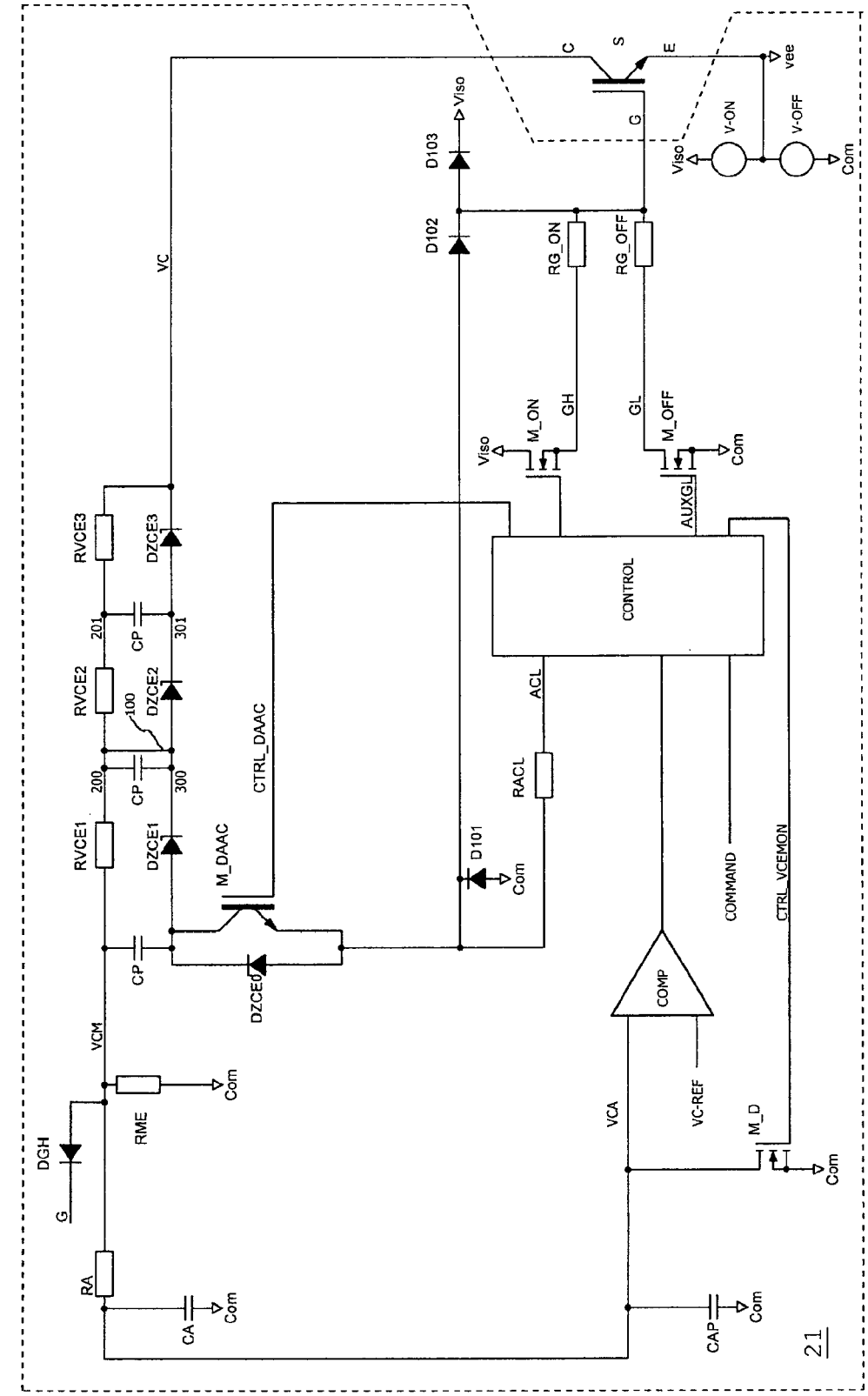
FIG. 5 shows a schematic circuit diagram of a circuit configuration having a second exemplary embodiment of a driving circuit according to the present invention and a power semiconductor switch.

FIG. 5 shows a circuit configuration 11 having a second exemplary embodiment of a driving circuit 21 and a power semiconductor switch S, in which comparator COMP and control unit CONTROL of the signal-processing unit are implemented separately, and control unit CONTROL is assigned two output stages M_ON and M_OFF, each of which is connectable or connected to gate G of power semiconductor switch S. Power semiconductor switch S is turned on and operated in the ON state by control unit CONTROL via output stage M_ON. Power semiconductor switch S is turned off and operated in the OFF state by control unit CONTROL via output stage M_OFF.

In contrast to the first exemplary embodiment shown in FIG. 4, the resistor series circuit has three resistors RVCE1, RVCE2, RVCE3. In addition, the series circuit of semiconductor devices, which are operated in breakdown in response to the exceedance of a specific, predefined collector-emitter voltage, has four semiconductor devices DZCE0, DZCE1, DZCE2, DZCE3. Semiconductor device DZCE0 preferably has a breakdown voltage of more than 100 V, as well, and may likewise be implemented as a Zener diode, an avalanche diode or a transient-voltage suppressor diode. Terminal 300 between the two semiconductor devices DZCE1 and DZCE2 is connected via a conductive interconnect 100 to a terminal 200 between resistors RVCE1 and RVCE2, that is, as viewed from the response-time network, to first intermediate terminal 200 of the resistor series circuit, intermediate terminal 200 being at a first intermediate potential. This intermediate potential is held constant and therefore stabilized with the aid of conductive interconnect 100 at least for a time, namely, for the time of the breakdown of semiconductor device DZCE1, by limiting it to a value which is determined by semiconductor device DZCE1 operated in breakdown, especially by its breakdown voltage, that preferably is greater than 100 V. As in the case of the exemplary embodiment shown in FIG. 4, in response to the exceedance of the breakdown voltages of semiconductor devices DZCE0, DZCE1, DZCE2, DZCE3, control unit CONTROL preferably increases the gate signal for gate G of power semiconductor switch S, that is, increases its (instantaneous) value.

The advantage of stabilizing the potential at the intermediate terminal, i.e., output 200 of the resistor series circuit, is that the unwanted influence of parasitic capacitors CP, which are assigned to resistors RVCE1, RVCE2, RVCE3 of the resistor series circuit (see FIG. 5), on the response time is reduced. Another advantage is that the expenditure on component parts is not increased in comparison to driving circuit 2" shown in FIG. 3. It is further advantageous that the stabilized potential at the intermediate terminal, i.e., output 200 of the resistor series circuit, is greater than the feeding or supply voltage available in the driving circuit, in particular, is greater than the gate signal or the potential at gate G in the ON state of power semiconductor switch S and than potential Viso of a voltage source V_ON for feeding output stage M_ON for turning on or for the ON state of power semiconductor switch S. The ability of the driving circuit according to the present invention, that is, of a circuit configuration having such a driving circuit, to be optimized with respect to the constancy of the response time in a wide range of the collector-emitter voltage is thereby improved considerably, so that the unwanted influence of parasitic capacitor CAP assigned to the input side of the signal-processing unit, i.e., to its comparator COMP, is reduced without having to increase the current through, and therefore the power loss of resistors RVCE1, RVCE2, RVCE3 of the resistor series circuit.

One or more further conductive interconnects may be provided, each of which connects a collector-side output 301 of one of the further semiconductor devices DZCE2 of the semiconductor-device series circuit to a further intermediate terminal 201 of the resistor series circuit. In this manner, the ability of the driving circuit of the present invention to be optimized in terms of thermal resistances, insulation coordination with regard to possible air clearances and creepage distances and multiplicity of variants (e.g., alternative equipment for different IGBT classes) may be improved advantageously.

Disposed indirectly or directly parallel to semiconductor device DZCE0 of the semiconductor-device series circuit furthest from the collector is preferably a switch M_DAAC whose gate CTRL_DAAC is connected directly or indirectly to an output of the signal-processing unit, that is, of control unit CONTROL. Driving circuit 21 is now formed in such a way that the signal-processing unit, i.e., control unit CONTROL preferably closes switch M_DAAC in the ON state of power semiconductor switch S and preferably at the beginning of the circuit-breaking operation of power semiconductor switch S. Semiconductor device DZCE0 is thereby bypassed, and the voltage across semiconductor device DZCE0 and thus the sum of the voltages across semiconductor devices DZCE0, DZCE1, DZCE2, DZCE3 is reduced when semiconductor devices DZCE0, DZCE1, DZCE2, DZCE3 are operated in breakdown during the circuit-breaking operation of power semiconductor switch S. This leads to a better utilization of the performance capability of power semiconductor switch S, without leaving its safe operating area.

Stabilizing the potential at intermediate terminal or output 200 of the resistor series circuit is also advantageous because an unwanted transfer of charge between parasitic capacitors CP and response-time capacitor CA during the switchover of switch M_DAAC for realizing the dynamic active-clamping function is able to be reduced, which makes it even considerably easier to hold the response time constant in a wide range of the collector-emitter voltage.

For the case when semiconductor device DZCE1, connected with conductive interconnect 100, is an active part of a semiconductor-device series circuit for realizing an active clamping function, as shown in FIGS. 4 and 5 (and also in FIG. 7), semiconductor device DZCE1 is fed from collector C of power semiconductor switch S via conductive interconnect 100 and the resistor series circuit for realizing the VCE monitoring, so that advantageously, semiconductor device DZCE1 requires no additional auxiliary feeding, whose potential exceeds the supply voltage of the driving circuit according to the present invention.

Voltage VCA at the first input of the signal-processing unit or of comparator COMP and/or voltage VCM at the resistor-series-circuit output remote from the collector should be limited to values which are able to be processed by the subsequent signal-processing unit or subsequent comparator COMP. To that end, the anode of a diode DGH is connected to the resistor-series-circuit output remote from the collector (see FIG. 5), or alternatively, to the first input of the signal-processing unit or of comparator COMP, the cathode of diode DGH being connected or connectable to gate G of power semiconductor switch S. Especially in the last case, the diode may advantageously be implemented monolithically, that is, within the signal-processing unit or comparator COMP. Instead of diode DGH, one or more semiconductor devices operated in breakdown, e.g., Zener diodes, avalanche diodes and/or transient-voltage suppressor diodes, analogous to diode DGH, may also be connected to the resistor-series-circuit output remote from the collector or to the first input of the signal processing unit or of comparator COMP.

Figure 6:
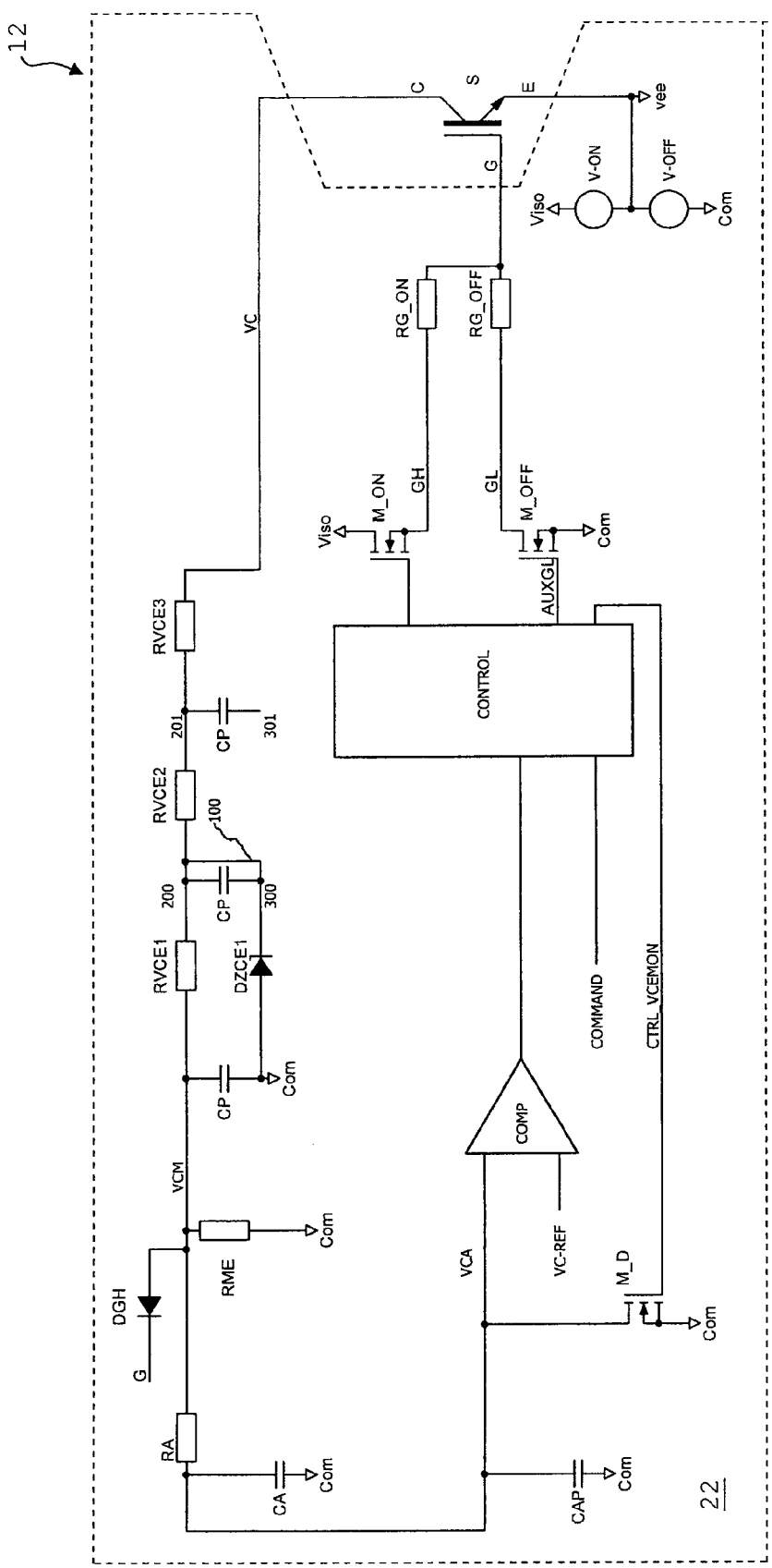
FIG. 6 shows a schematic circuit diagram of a circuit configuration having a third exemplary embodiment of a driving circuit according to the present invention and a power semiconductor switch.

FIG. 6 shows a circuit configuration 12 having a third exemplary embodiment of a driving circuit 22 according to the present invention, and a power semiconductor switch S. In contrast to the exemplary embodiments in FIGS. 4 and 5, only one semiconductor device DZCE1 is provided, which in response to the exceedance of a specific, predefined collector-emitter voltage, is operated in breakdown and therefore at constant potential at least for a time, and which, for example, is a single Zener diode, avalanche diode or transient-voltage suppressor diode. The breakdown voltage of semiconductor device DZCE1 is preferably greater than 100 V. The cathode-side output 300 of semiconductor device DZCE1 is connected via conductive interconnect 100 to intermediate terminal 200 between resistors RVCE1 and RVCE2 of the resistor series circuit, so that upon exceedance of the predefined collector-emitter voltage, the intermediate voltage at intermediate terminal 200 is stabilized by the potential at cathode-side output 300 of semiconductor device DZCE1. Optionally, as shown in FIG. 6, the further semiconductor devices DZCE0, DZCE2, DZCE3 shown in FIG. 5 and the wiring with switch M_DAAC, controlled via control unit CONTROL, for realizing an active clamping function may be omitted, in doing which, holding the response time of driving circuit 22 constant for a wide range of the collector-emitter voltage is simplified considerably in the third exemplary embodiment shown in FIG. 6, as well, and driving circuit 22 is thus optimized in this regard.

Figure 7:
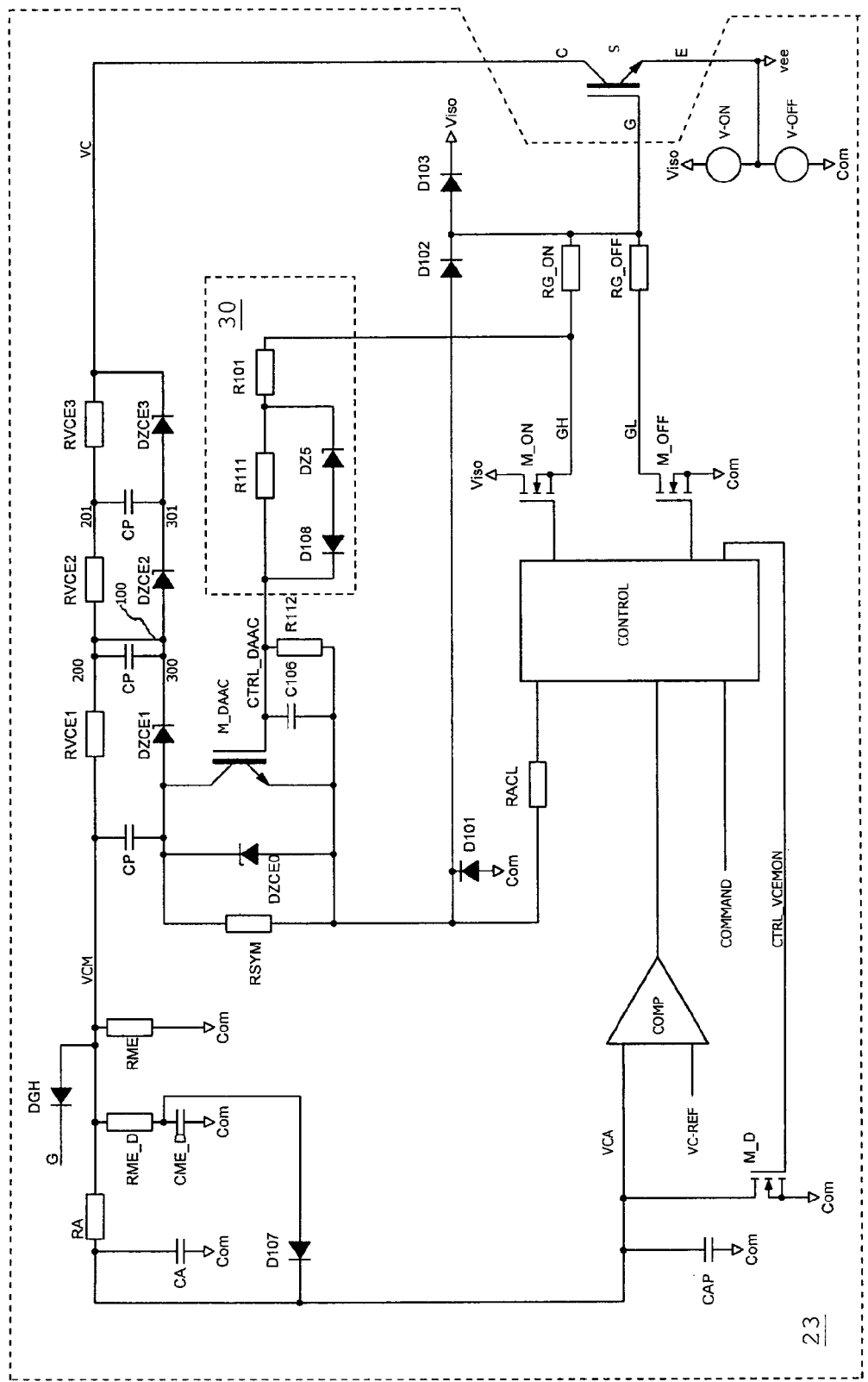
FIG. 7 shows a schematic circuit diagram of a circuit configuration having a fourth exemplary embodiment of a driving circuit according to the present invention and a power semiconductor switch.

FIG. 7 shows a circuit configuration 13 having a fourth exemplary embodiment of a driving circuit 23 according to the present invention, and a power semiconductor switch S. In comparison to the exemplary embodiments illustrated in FIGS. 4 through 6, a frequency-dependent and/or time-dependent impedance, used for the signal processing, is provided, which is positioned so that it is between the resistor series circuit and response-time network RA, CA and parallel to response-time network RA, CA, and whose input is at potential VCM at the output of the resistor series circuit and whose output is at a reference potential Com or perhaps vee of driving circuit 23. As shown in FIG. 7, the frequency-dependent and/or time-dependent impedance preferably includes a series connection of a resistor RME_D and a capacitor CME_D or a series connection of resistor RME_D and a switch (not shown) controlled by the signal-processing unit, i.e., control unit CONTROL. The purpose of the frequency-dependent and/or time-dependent impedance is to realize a dynamic VCE monitoring together with the resistor series circuit. A diode D107 may be provided, whose anode is connected between resistor RME_D and capacitor CME_D and whose cathode is connected to the output of response-time network RA, CA or to the first input of the signal-processing unit, that is, of comparator COMP. Diode D107 is used to accelerate the discharging of capacitor CME_D in order to ensure a safe starting condition/a safe starting state for capacitor CME_D, even in the case of short off-times of power semiconductor switch S. The dynamic VCE monitoring is used for the temporary decrease of measured value VCM of the collector-emitter voltage to advantageously compensate for the time characteristic of the collector-emitter voltage upon turning power semiconductor switch S on.

Furthermore, in comparison to FIGS. 5 and 6, FIG. 7 shows a driving circuit 23 according to the present invention having a detailed wiring of switch M_DAAC, which is closed by the signal-processing unit or control unit CONTROL in the ON state and at the beginning of the turn-off state of power semiconductor switch S in order to bypass semiconductor device DZCE0 to realize a dynamic active-clamping function. During the OFF state of power semiconductor switch S, switch M_DAAC is open.

In order to drive switch M_DAAC, its gate CTRL_DAAC is connected, preferably via a driving network 30 made up in particular of two resistors R111 and R101 connected in series, a diode D108 and a Zener diode DZ5 (or perhaps an avalanche diode or a transient-voltage suppressor diode), to gate G or to output GH (shown thus in FIG. 7) of output stage M_ON of the signal-processing unit, i.e., of control unit CONTROL, responsible for the ON state of power semiconductor switch S. Alternatively, a signal derived or derivable from the characteristic of the potential at output GH, the potential at gate G or a switching command COMMAND for the signal-processing unit, i.e., of control unit CONTROL, forms the input signal for driving network 30 connected in incoming circuit to switch M_DAAC, that is, forms the actuating signal for switch M_DAAC. Thus, the energy or gate charge for the operation of switch M_DAAC is drawn directly from regular gate G or output GH of output stage M_ON responsible for the ON state of power semiconductor switch S, or a signal derived therefrom. Advantageously, it is thereby possible to dispense with an additional, relatively complex "charge pump" or "bootstrap" feeding of switch M_DAAC. Diode D108 and Zener diode DZ5 are connected to each other on the anode side and connected in parallel to resistor R111.

Provided between driving network 30 and switch M_DAAC is preferably a parallel connection of a resistor R112 and a capacitor C106, which is connected to the gate of switch M_DAAC and to its power terminal for the current removal. Due to resistor R111 of driving network 30, capacitor C106 and the input capacitance of switch M_DAAC, the opening operation of switch M_DAAC is delayed relative to the input signal of driving network 30, i.e., relative to the actuating signal, which is given by way of example in FIG. 7 by the potential at output GH of output stage M_ON, so that during the opening operation of power semiconductor switch S, switch M_DAAC remains closed and only completely opens in the OFF state of power semiconductor switch S.

Diode D108 is used to accelerate the closing operation of switch M_DAAC, so that even in the case of short on-times of power semiconductor switch S, it is ensured that switch M_DAAC is reliably closed during the subsequent opening operations of power semiconductor switch S.

Due to resistor R112 and Zener diode DZ5, the actuating signal for switch M_DAAC is reduced in accordance with the safe operating area of switch M_DAAC. Resistor R101 is used to reduce a peak current load at gate CTRL_DAAC of switch M_DAAC, and thus to reduce a peak current load at output GH of output stage M_ON (which peak current load could lead to less current at gate G of power semiconductor switch S), so that the entire conductivity of driving circuit 23 is available for the driving and operation of power semiconductor switch S.

In addition, preferably a resistor RSYM is connected in parallel to semiconductor device DZCE0 and switch M_DAAC, and is used to stabilize the output voltage of switch M_DAAC in the case of greater leakage currents of semiconductor device DZCE1 or in the case of leakage currents of semiconductor device DZCE0 which are less than leakage currents of semiconductor device DZCE1. In this manner, in the case of greater leakage currents of semiconductor device DZCE1 or smaller leakage currents of semiconductor device DZCE0 in comparison to the leakage currents of semiconductor device DZCE1, a jump in potential at the output of that semiconductor device DZCE1 of the semiconductor-device series circuit to which conductive interconnect 100 is connected, in response to the closing operation of power semiconductor switch S is advantageously avoided. Such a jump in potential would result in an unintentional transfer of charge from parasitic capacitors CP to response-time capacitor CA.

What is claimed is:

1. A driving circuit for driving a power semiconductor switch, comprising a signal-processing unit for generating a gate signal for a gate of the power semiconductor switch, the driving circuit including a resistor series circuit which is connectable to a power terminal, used for the current supply, of the power semiconductor switch, and whose output is connected to a first input of the signal-processing unit, and the signal-processing unit having a second input for a reference voltage for the collector-emitter voltage of the power semiconductor switch, wherein at least one semiconductor device is provided which is implemented in such a way that it is operated in breakdown in response to the exceedance of a specific collector-emitter voltage of the power semiconductor switch, an output of the at least one semiconductor device being connected via a conductive interconnect to a terminal between the resistors of the resistor series circuit or to the resistor-series-circuit output which is connected to the signal-processing unit, and the breakdown voltage of the at least one semiconductor device being selected in such a way that the potential at the output of the at least one semiconductor device is greater than the potential at the gate of the power semiconductor switch in the ON state of the power semiconductor switch, wherein a further semiconductor device is provided which is connected in series to the at least one first semiconductor device, a switch being positioned parallel to this further semiconductor device and its gate being connected indirectly or directly to an output of the signal-processing unit, to which output, in particular, the gate of the power semiconductor switch is connectable, the driving circuit being implemented in such a way that the signal-processing unit closes the switch in the ON state of the power semiconductor switch and/or at the beginning of the circuit-breaking operation of the power semiconductor switch.

2. The driving circuit as recited in claim 1,
wherein
the potential at the output of the at least one semiconductor device, particularly the breakdown voltage of the at least one semiconductor device, is greater than 100 V.

3. The driving circuit as recited in claim 1,
wherein
the at least one semiconductor device is a Zener diode, an avalanche diode and/or transient-voltage suppressor diode.

4. The driving circuit as recited in claim 1,
wherein
a plurality of semiconductor devices are provided, which are connected in series.

5. The driving circuit as recited in claim 4,
wherein
at least one further conductive interconnect is provided which connects an output of one of the further semiconductor devices to a further terminal between the resistors of the resistor series circuit.

6. The driving circuit as recited in claim 1,
wherein
the output of the resistor series circuit is connected via a response-time network to the first input of the signal-processing unit, the response-time network including a response-time resistor.

7. The driving circuit as recited in claim 6,
wherein
provided between the resistor series circuit and the response-time network and parallel to the response-time network, is a frequency-dependent and/or time-dependent impedance which, in particular, includes a series connection of a resistor and a capacitor, or the series connection of a resistor and a switch controlled by the signal-processing unit.

8. A method for driving a power semiconductor switch having a driving circuit as recited in claim 1, the signal-processing unit ascertaining, from the signal applied to its first input and from the reference voltage for the collector-emitter voltage of the power semiconductor switch, a gate signal for the gate of the power semiconductor switch,
wherein
in response to the exceedance of a specific collector-emitter voltage, the at least one semiconductor device is operated in breakdown and the potential at that output of the resistor series circuit which is connected with the conductive interconnect, or at the terminal which is between the resistors of the resistor series circuit and is connected with the conductive interconnect, is limited to a value which is greater than the potential at gate of the power semiconductor switch in the ON state of the power semiconductor switch,
wherein
in at least one of the ON state of the power semiconductor switch and the beginning of the circuit-breaking operation of the power semiconductor switch, the voltage across a further semiconductor device, which is connected in series to the at least one semiconductor device, is reduced with the aid of a switch, positioned parallel to this further semiconductor device, when the semiconductor devices are operated in breakdown mode.

9. The method as recited in claim 8,
wherein
the potential at that output of the resistor series circuit which is connected with the conductive interconnect, or at the terminal which is between the resistors of the resistor series circuit and is connected with the conductive interconnect, is limited to a value which is greater than 100 V.

10. The method as recited in claim 8,
wherein
in response to the exceedance of the breakdown voltage of the at least one semiconductor device, the signal-processing unit increases the value of the gate signal for the gate of the power semiconductor switch.

11. The method as recited in claim 8,
wherein
the actuating signal for the switch positioned parallel to the further semiconductor device is formed by the gate signal for the gate of the power semiconductor switch or is derived from it or from a switching command for the signal-processing unit.

* * * * *

UNITED STATES PATENT AND TRADEMARK OFFICE
CERTIFICATE OF CORRECTION

PATENT NO. : 8,598,921 B2  
APPLICATION NO. : 13/421581  
DATED : December 3, 2013  
INVENTOR(S) : Jan Thalheim et al.

Page 1 of 1

It is certified that error appears in the above-identified patent and that said Letters Patent is hereby corrected as shown below:

On the title page, item (30), under Foreign Application Priority Data,
Change "11002165" to -- 11002165.6 --.

Signed and Sealed this
Twenty-fifth Day of November, 2014

Michelle K. Lee
*Deputy Director of the United States Patent and Trademark Office*